(12) United States Patent
Nelson et al.

(10) Patent No.: US 6,650,261 B2
(45) Date of Patent: Nov. 18, 2003

(54) SLIDING WINDOW COMPRESSION METHOD UTILIZING DEFINED MATCH LOCATIONS

(75) Inventors: William E. Nelson, Penfield, NY (US); James M. Sweet, Rochester, NY (US); Norman W. Zeck, Webster, NY (US); Ronald E. Rider, Menlo Park, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/175,242

(22) Filed: Jun. 18, 2002

(65) Prior Publication Data

US 2003/0048207 A1 Mar. 13, 2003

Related U.S. Application Data

(60) Provisional application No. 60/317,695, filed on Sep. 6, 2001.

(51) Int. Cl.[7] .................................................. H03M 7/00
(52) U.S. Cl. ........................... 341/106; 341/87; 341/51; 341/50; 709/247; 382/232
(58) Field of Search ............................... 341/51, 50, 84, 341/106; 709/247, 218; 358/1.15; 382/232, 236

(56) References Cited

U.S. PATENT DOCUMENTS

| | | | | | |
|---|---|---|---|---|---|
| 4,558,302 | A |   | 12/1985 | Welch | 340/347 DD |
| 4,847,619 | A | * | 7/1989 | Kato et al. | 341/106 |
| 5,652,581 | A | * | 7/1997 | Furlan et al. | 341/51 |
| 5,689,255 | A | * | 11/1997 | Frazier et al. | 341/51 |
| 5,694,125 | A | * | 12/1997 | Owsley et al. | 341/50 |
| 6,008,743 | A | * | 12/1999 | Jaquette | 341/51 |
| 6,320,522 | B1 | * | 11/2001 | Satoh | 341/51 |

* cited by examiner

Primary Examiner—Michael Tokar
Assistant Examiner—Lam T. Mai
(74) Attorney, Agent, or Firm—William Eipert

(57) ABSTRACT

An improved sliding window dictionary-based compression method limits the data within the sliding window searched to data strings occurring at each discrete match location within a plurality of predefined discrete match locations, the plurality of predefined discrete match locations comprising a set of non-continuous data positions within the window of data.

16 Claims, 4 Drawing Sheets

|  | J − 2 | J − 1 | J | J + 1 | J + 2 | J + 3 | J + 4 |
|---|---|---|---|---|---|---|---|
| I − 2 | 88 | 88 | $P_{i-2,j}$ 92 | 94 | 94 | 88 | 88 |
| I − 1 | 88 | 90 | $P_{i-1,j}$ 92 | 94 | 94 | 96 | 88 |
| I | 96 | $P_{i,j-1}$ 88 | $P_{i,j}$ 90 | $P_{i,j+1}$ 92 | $P_{i,j+2}$ 94 | $P_{i,j+3}$ 94 | $P_{i,j+4}$ 96 |
| I + 1 | 94 | 96 | 90 | 92 | 96 | 94 | 92 |

FIG. 2

SLIDING WINDOW COMPRESSION METHOD UTILIZING DEFINED MATCH LOCATIONS

This application is based on a Provisional Patent Application No. 60/317,695, filed Sep. 6, 2001.

BACKGROUND OF THE INVENTION

The present invention relates generally to data compression, and more particularly, to systems and methods of implementing dictionary-based compression.

A wide variety of digital data signals such as data files, documents, photographic images and the like are often compressed to save storage costs or to reduce transmission time through a transmission channel. By decreasing the required memory for data storage and/or the required time for data transmission, compression can yield improved system performance and a reduced cost.

A well known and widely used type of lossless compression, generally referred to as substitutional or dictionary-based compression, exploits the property of many data types to contain repeating sequences of characters. Good examples of such data are text files (a sequence of alphanumeric characters) and raster images (a sequence of pixels). Dictionary-based compression methods exploit this tendency to include repeating character sequences by replacing substrings in a data stream with a code word that identifies that substring in a dictionary. This dictionary can be static if knowledge of the input stream and statistics are known, or it can be adaptive. Adaptive dictionary schemes are better at handling data streams where the statistics are not known or vary.

Adaptive dictionary-based compression techniques can be typed into two related groups. Methods of the first group determine if a character sequence currently being compressed has already occurred earlier in the input data and, if so, rather than repeating it they output a pointer to the earlier occurrence. With this type, the dictionary is represented by the strings of characters occurring in the previously processed data. Methods of the second group build the dictionary entries using character strings encountered in the data stream as it is processed. With both groups, the dictionary is all or a portion of the input stream that has been processed previously. Using previous strings from the input stream often makes a good choice for the dictionary, as substrings that have occurred will likely reoccur. The other advantage to these types of dictionary based compression is that the dictionary is transmitted essentially at no cost, because the decoder can generate the dictionary from the previously coded input stream.

Both groups of dictionary coders can be represented by two related techniques developed by Lempel and Ziv. Methods of the first group are based on an algorithm often referred to as LZ77 and the methods of the second group are based on an algorithm often referred to as LZ78. The many variations of dictionary-based compression algorithms differ primarily in how pointers are represented and to what the pointers are allowed to refer.

Briefly, LZ77 type coding operates on an input stream comprising the sequence of characters to be compressed. Encoders of this type are relatively easy to implement and generally perform a pattern matching technique followed by a variable bitlength encoding scheme such as Huffman encoding. These encoders search a sliding window to locate the longest match with the character sequence beginning with the character at the current coding position. If a match is found, a pointer is provided that identifies the location in the window at which the matching string begins and the length of the string. Searching can be accelerated by indexing prior substrings with a tree, hash table, or binary search tree.

In contrast to LZ77, where pointers can refer to any substring in the window of prior data, the LZ78 method places restrictions on which substrings can be referenced. However, LZ78 does not have a window to limit how far back substrings can be referenced. LZ78 type encoders build the dictionary by matching the current substring from the input stream to a dictionary of previously encountered strings. This stored dictionary is adaptively generated based on the contents of the input stream. The encoding process analyzes a string comprising a prefix and a current character in the data stream, beginning with an empty prefix. If the corresponding string (prefix+the current character) is present in the dictionary, the prefix is extended with the current character and a new string comprising the extended prefix and next character is analyzed. This extending is repeated until a string which is not present in the dictionary is encountered. At that point, the encoder outputs (a) a code word that represents the current prefix and (b) the current character. The encoder also creates a new dictionary entry comprising the current prefix and current character string. The encoder then begins building a new string with an empty prefix and the next character in the data stream. Further information on dictionary based compression can be found in U.S. Pat. No. 4,558,302 entitled "High Speed Data Compression and Decompression Apparatus and Method" incorporated herein by reference.

Dictionary-based lossless compression adapt well to a variety of input raster data types and thus are well suited for use in digital printing systems. However, with raster data it has been seen that better matches are often found at scan line intervals in the history buffer. This requires implementations of dictionary-based lossless compression systems to have a large history buffer that has to contain several scan lines of data. In both software and hardware, implementations increasing the size of this buffer are more expensive in terms of implementation costs or reduced performance. In particular for hardware implementations, this memory is often a specialized memory such as a content addressable memory which requires more circuits to implement vs. standard memory that is not content addressable. Another disadvantage with the dictionary based encoders is that the implementation is inherently serial and does not make use of the inherent parallelism available in many processor architectures resulting in lost (or unused) instruction slots and decreased performance.

SUMMARY OF THE INVENTION

In accordance with one aspect of the teachings herein, there is provided an improved dictionary-based compression method in which a sliding window data is searched locate a longest string within the sliding window that matches a string beginning at a current coding position. The improved method limits the data within the sliding window searched to data strings occurring at each discrete match location within a plurality of predefined discrete match locations, the plurality of predefined discrete match locations comprising a set of non-continuous data positions within the window of data.

There is further provided a method of compressing data that includes receiving an input stream of data, the input stream including a sequence of pixels to be compressed;

identifying a coding position; comparing strings of pixels occurring at each match location within a plurality of predefined match locations to identify a match with a compress string, the compress string including a string of pixels occurring at the coding position, the plurality of predefined match locations defining a set of discrete, non-continuous pixels from the input stream; and providing a pointer, the pointer identifying a predefined match location which matches the compress string and the length of the compress string.

The teachings herein further provide a method of compressing data that exploits the property that, for some types of data, it is possible to identify certain match locations within the data that are more likely to contain a matching pattern than the average location. To exploit this property, one aspect of the present teachings is a compression method which limits the search for matching strings within the window of data to those character strings occurring at a such match locations. By identifying areas of a data stream that are more likely to contain matching data and limiting the search for compression strings to those areas, the compression process can operate in parallel to simultaneously compare data at the match locations. This parallel operation can result in a reduction in the processing time necessary to compress a file as compared to conventional methods. One such embodiment of a method of compressing data includes receiving an input stream of data, the input stream including a sequence of data elements to be compressed; selecting a compress string within the input stream, the compress string including at least one data element occurring at a coding position; identifying a plurality of match locations associated with the coding position; setting a status for each match location with the plurality of match locations, the status identifying whether the corresponding match location is active or inactive; simultaneously comparing the compress string with data elements match locations having an active status to determine if a match exists at the respective match location, and updating the status of the match location based on the comparison; increasing the length of the compress string by adding at least one data element to the compress string; and repeating the steps of simultaneously comparing and increasing the length of the compress string until all match locations within the plurality of match locations have an inactive status; and providing a pointer, the pointer identifying a match location which matches the compress string and the length of the compress string.

BRIEF DESCRIPTION OF THE DRAWINGS

FIG. 2 shows a shows a portion of raster ordered image data;

DETAILED DESCRIPTION OF THE INVENTION

Figure 1:
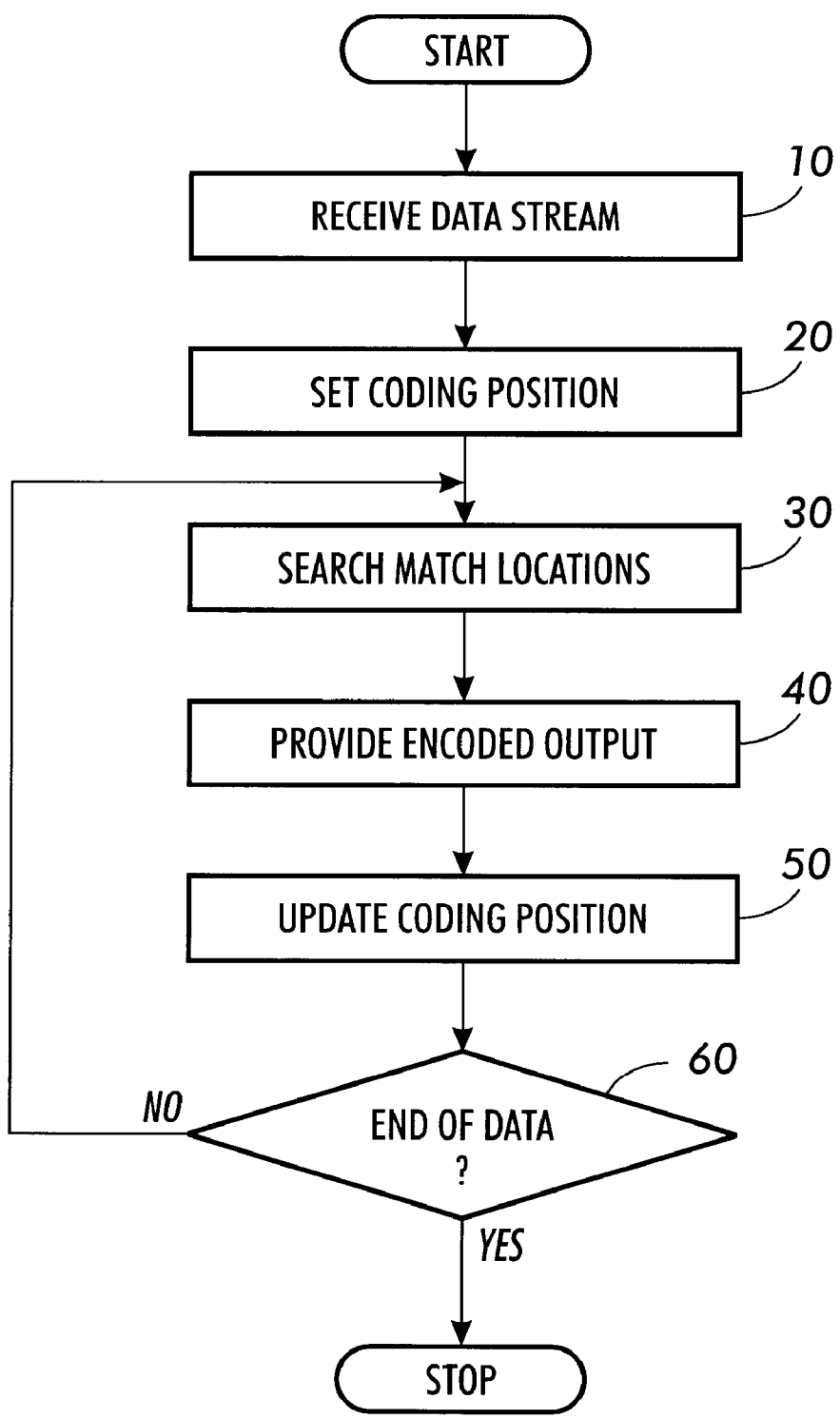
FIG. 1 is a flowchart illustrating an embodiment of a hotspot compression method in accordance with teachings of the present invention.

The following will be a detailed description of the drawings which are given for purposes of illustrating the embodiments disclosed herein, and not for purposes of limiting the same. In this description, as well as in the drawings, like reference numbers represent like devices, circuits, or circuits performing equivalent functions.

Prior art sliding window dictionary compression methods exploit the inherent property of many data files to contain repeating sequences of characters. Briefly reviewing, sliding window based methods operate on an input stream of data comprising the sequence of characters to be compressed, wherein the term character is used to identify the basic data element, which may for example be an alphanumeric character in a text file or a pixel in an image file, in the input stream. The method searches a window of n characters looking for the longest character sequence within the window that matches the character sequence beginning with the character at the current coding position within the data stream being compressed. The coding position identifies the location within the data stream of the characters to be encoded. That is, the coding position identifies the beginning character of the sequence for which the longest match in the sliding window is being located. If a match is found, the method outputs a pointer identifying the location of the matching sequence in the sliding window and the length of the sequence. The method then advances the coding position ahead a number of characters equal to the length of the match. In effect, these methods keep track of the last n bytes of data seen (often windows of 32 k are used), and when a sequence of data is encountered that has already been seen, they output a pair of values corresponding to the position of the sequence in the previously-seen buffer of data, and the length of the phrase.

In a conventional decompression operation associated with the compression method, sliding window is maintained the same way as while encoding. In each step the decompression method reads the pointer for the encoded (compressed) data and outputs the sequence from the window at the specified location and length. If a null pointer is retrieved, the process simply outputs the following character.

The present invention exploits another property that has been observed to occur in some data files. Specifically, it has been discovered that for some types of data files it is possible to identify certain compression "hotspots". These hotspots are locations within the window that are significantly more likely to contain a matching pattern than the average location. To exploit this property, one aspect of the present invention proposes a compression method which limits the search for matching strings within the window of data to those character strings occurring at a set of discrete match locations wherein each discrete match location within the set corresponds to a compression hotspot.

In a conventional sliding window method, such as GZIP, a 32 k window is examined for pattern matches. By reducing the number of potential pattern match locations from 32767 down to a small set of discrete match locations, such as ten locations, a brute force pattern matching approach now becomes viable. On processor architectures that have inherent parallelism, all of the discrete match locations with the set can be examined in parallel, allowing most or all instruction slots to be filled which can yield a significant performance improvement over the conventional hashing approach to string matching.

It should be appreciated that the reduction comes at a cost. Although the set of discrete match locations account for a higher fraction of the pattern matches than other distances, some opportunities for pattern matching will be lost.

However, this is balanced by an increase in Huffman coding efficiency and a decrease in the time and processing required to compress a file.

Referring now to FIG. 1 there is shown a flow diagram of a sliding window dictionary-based compression method illustrating teachings of an embodiment of the present invention. More specifically, FIG. 1 is an example of one embodiment of a what is referred to herein as a hotspot compression technique which limits the search for matching strings within the window of data to those strings at one of a set of predefined match locations wherein each predefined match location within the set corresponds to a compression hotspot. That is the set of predefined match locations comprise those locations within the window that, based upon a priori knowledge, are believed to be significantly more likely to contain a matching pattern than the average location.

The method shown in FIG. 1 begins with the receipt of an input stream of data to be compressed at step 10. The input stream of data comprises a stream of data elements such as a sequence of characters or pixels. For purposes of discussion, the data stream will be considered as a stream of image data comprising a sequence of pixels. At step 20, the method sets the coding position to the beginning of the input stream.

At step 30, the method searches a range of data within the input stream to identify the longest match with the string the pixel string beginning with the pixel corresponding to the coding position. In accordance with one aspect of the present teachings, the range of data within the input stream that is searched is limited to those pixels strings located at each of a plurality of predefined discrete match locations. Each match location can be identified by its position within the sliding window relative to the coding position such as an offset from the coding position. Alternatively, each match can be identified by its absolute position within the input data stream or the sliding window. The plurality of match locations define set of non-continuous pixel positions corresponding with the locations that have been identified as being significantly more likely to contain a matching pattern than the average location. That is, step 30 compares the pixel strings at each one of plurality of predefined match locations to find the longest pixel string which matches the pixel string beginning with the pixel corresponding to the coding position.

At step 40, the method provides the encoded output for the current coding position. More specifically, if a match was found, the method provides a pointer identifying the match location having the longest matching pixel string and the length of the matching string. If a match was not found, the method provides a null pointer and the pixel at the coding position. At step 50, if the end of the image data has not been reached, the method updates the coding position to the next pixel position within the image data that is to be coded and returns to step 30. If the end of the input stream has been reached, the method ends.

As previously described, reducing the number of potential pattern match locations down to a small set of discrete match locations enables a brute force pattern matching approach wherein the discrete match locations can be examined in parallel which can yield a significant performance improvement over the conventional hashing approach to string matching. An example of a process to compare the pixel strings at each one of plurality of predefined match locations (hotspots) to locate matching strings at a hotspot match location, such as is performed at step 30 above, which can be implemented in a parallel fashion is given by the following psuedo code:

```
<BEGIN PSEUDO-CODE>
hotspot1 match length = 0
set hotspot1 to be 'active'
hotspot2 match length = 0
set hotspot2 to be 'active'
   M
hostspotN match length = 0
set hotspotN to be 'active'
while hotspot1 is 'active' OR
hotspot2 is 'active' OR . . . OR hotspotN is 'active' , do
   get next character of input stream
   if hotspot1 is 'active' AND the next character matches at hotspot1 then
      increment hotspot1 match length
   else
      set hotspot1 to be 'inactive'
   end if
   if hotspot2 is 'active' AND the next character matches at hotspot2 then
      increment hotspot2 match length
   else
      set hotspot2 to be 'inactive'
   end if
   M
   if hotspotN is 'active' AND the next character matches at hotspotN then
      increment hotspotN match length
   else
      set hotspotN to be 'inactive'
   end if
end while
best match length = minimum match length − 1
best match pointer = NULL
if hotspot1 match length > best match length then
   best match length = hotspot1 match length
   best match pointer = pointer to hotspot1
end if
if hotspot2 match length > best match length then
   best match length = hotspot2 match length
   best match pointer = pointer to hotspot2
end if
   M
if hotspotN match length > best match length then
   best match length = hotspotN match length
   best match pointer = pointer to hotspotN
end if
if best match length >= minimum match length then
   output a match using best match length and best match pointer
else
   output the next input stream character as a literal
end if
<END PSEUDO-CODE>
```

It should be appreciated that the various modifications to the above process may be made to achieve improved performance for a given application. For example, more than a single character may be read in at a time. That is, the process may be modified to read in and match 8 characters for each iteration of the while-loop rather than only 1.

An example of the operation of searching the a range of data within the input stream to identify the longest match with the string the pixel string beginning with the pixel corresponding to the coding position of step 30 of FIG. 1, will be discussed with additional reference to FIG. 2. FIG. 2 shows a portion of raster ordered image data, also referred to as scanline ordered image data. Raster ordered image data refers to image data that is ordered in a memory system or transmission channel such that pixels are in raster scan line sequence. That is, raster ordered image data has multiple scanlines with each scanline having multiple pixels in which pixels P within the input stream of image data are identified by $P_{i,j}$ wherein i identifies the scanline within the image data and j identifies a pixel position within the scanline. Thus, $P_{1,1}$ is the first pixel in the first scanline and is the first pixel in raster ordered sequence. $P_{1,2}$ is the second pixel in the first scanline and is the second pixel in the raster order sequence.

Referring to FIG. 2, assume that pixel $P_{i,j}$ corresponds to the current coding position and that three predefined match locations, one corresponding to the previous pixel location (i.e., $P_{i,j-1}$) and two at the distances of one and two scanline pitches (i.e., $P_{i-1,j}$ and $P_{i-2,j}$). As can be seen from FIG. 2, the string of 5 pixels beginning at the coding position $P_{i,j}$ has values 90, 92, 94, 94, 96. From examination of the figure, one can see that the longest pixel string occurring at each one of plurality of predefined match locations which matches the pixel string beginning with the pixel corresponding to the coding position is found at pixel $P_{i-2,j}$ and comprises the string 90, 92, 94, 94. The figure also shows that the string 90, 92, 94, 94, 96 is seen in the image data beginning at pixel location $P_{i-1,j-1}$. However, as the hotspot process limits the search to those string occurring at one of the predefined match locations $P_{i,j-1}$, $P_{i-1,j}$ or $P_{i-2,j}$ the process it will not identify the string beginning at $P_{i-1,j-1}$ as eligible for a match.

Those skilled in the art will recognize that for certain compression formats, such as the GZIP/Deflate file format, larger distances are encoded using both a Huffman code and some fixed width field, which grows as the magnitude of the distance increases. Thus, to encode a raster-order file using the teachings of the present invention to limit the search area to strings at predefined hotspot match locations, a cost function, which ignores long-distance pattern matches if the length of the match is below a certain threshold may be required. The cost function will limit matches found at long distance to those having a length greater than a threshold length. This cost function compensates for the extra cost introduced by the fixed width field in GZIP compression by ensuring that matches at long distance are a sufficient length.

Figure 3:
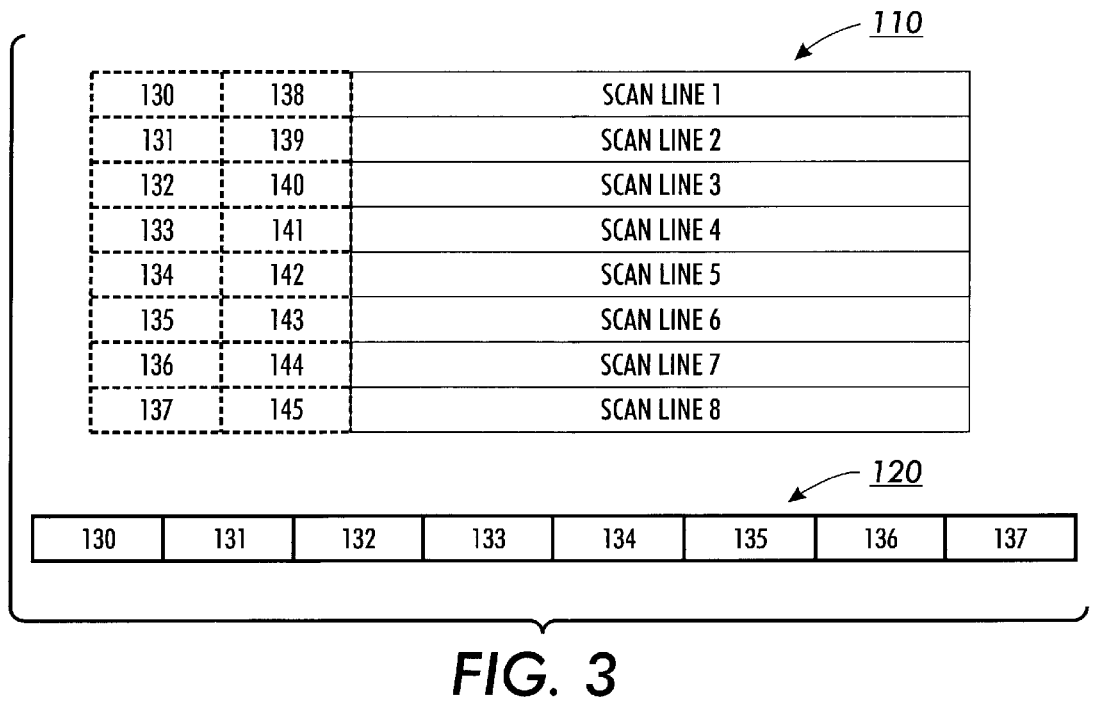
FIG. 3 illustrates an example of an ordering method converting raster ordered image data to block ordered image data.

Although the above described hotspot compression technique provides good results with pixel ordered data, better results have been seen when the input stream comprises block-ordered pixel data. This is due in part to the fact that the match locations for the block ordered data tend to be at a shorter distance, requiring a shorter pointer. FIG. 3 shows a diagram of one example of a specific ordering to convert raster data to block ordered pixel data, also referred to as vector ordered pixel data. Raster ordered data 110 is stored in memory such that sequential memory addresses will access pixels for scan line 1, then scan line 2, and so on. In FIG. 3, eight scan lines are shown as a embodiment to generate 8×8 blocks (a useful size, since JPEG uses the same size blocks). However, it should be appreciated that other numbers of scan lines are also possible.

Pixel data is vector ordered as shown by 120. The method reads pixel data 130 from scan line 1, which becomes first pixels of the vector 120. In the embodiment of FIG. 3, this pixel data 130 is a small portion of a scan line such as 8 pixels. It should be apparent that portions comprising fewer or greater numbers of pixels may also be used. Next, pixel data 131 from scan line 2 is copied which becomes the second set of pixels in vector 120. Beneficially, pixel data 131 comprises the same number of pixels as were included in pixel data 130. The process of copying is repeated for 132–137 to create a vector that is used as input to a hotspot dictionary compressor. Next the complete copying process is repeated for segments 138–145, and then repeated for the rest of the raster data contained in the scan lines in the memory buffer. Using this method of ordering, all the raster data from the scan lines are sent to the can be compressed using a hotspot compression technique. Once all the pixels of the scan lines have been ordered in this method, further scan lines of the image can be processed in the same procedure.

Figure 4:
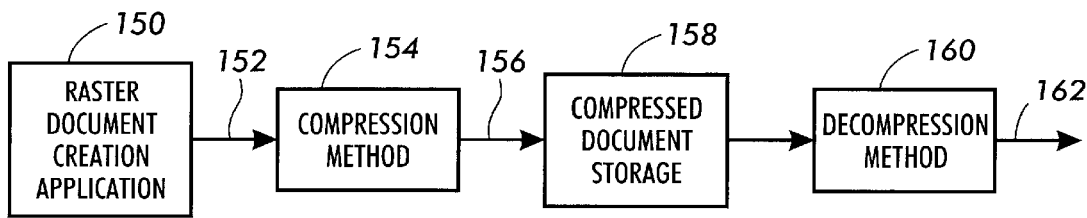
FIG. 4 shows a system in which the present invention may find application.

Referring now to FIG. 4, there is shown an environment in which the invention may be used. A raster document creation application 150 generates a raster order format document 152. The raster document creation application may be a raster editor or a system that converts a page description language document into a raster format, for example. Scan line raster data is sent to compression encoder 154 for compression. Compression encoder 154 implements a hotspot compression technique, which may be similar to the embodiment shown in FIG. 1, to generate a compressed format document 156. Prior to the compression of the document, compression encoder 154 may also implement a raster order to block order conversion of the input document 152. The compressed format document 156 is stored in the compressed format at document storage device 158. To regenerate the scan line raster format of the document, decompressor 160 uses a standard sliding window decompression method to process the compressed data 156.

As previously discussed, the hotspot compression technique limits the search for matching strings to those strings occurring at one of a set of predefined match locations. Furthermore, these predefined match locations are selected to correspond to those locations within the window that, based upon a priori knowledge, are believed to be significantly more likely to contain a matching pattern than the average location.

The a priori knowledge used for identifying match locations may be derived in a variety of sources. For example, knowledge of the structure and format of the file itself may identify potential hotspots for use as match locations. For example, consider a file comprising records which include fields which may be either text strings, numeric strings or mixed text and numeric strings. When compressing the file and the character at the current coding position is numeric data, the compression routine may limit the search for matching strings to the locations in the sliding window which correspond to those areas (fields) of the file that have numeric data while ignoring those fields with text or alphanumeric data. Similarly, when the current coding position is text data the compression routine may limit the search for matching strings to the locations in the sliding window which correspond to those areas having text.

Figure 5:
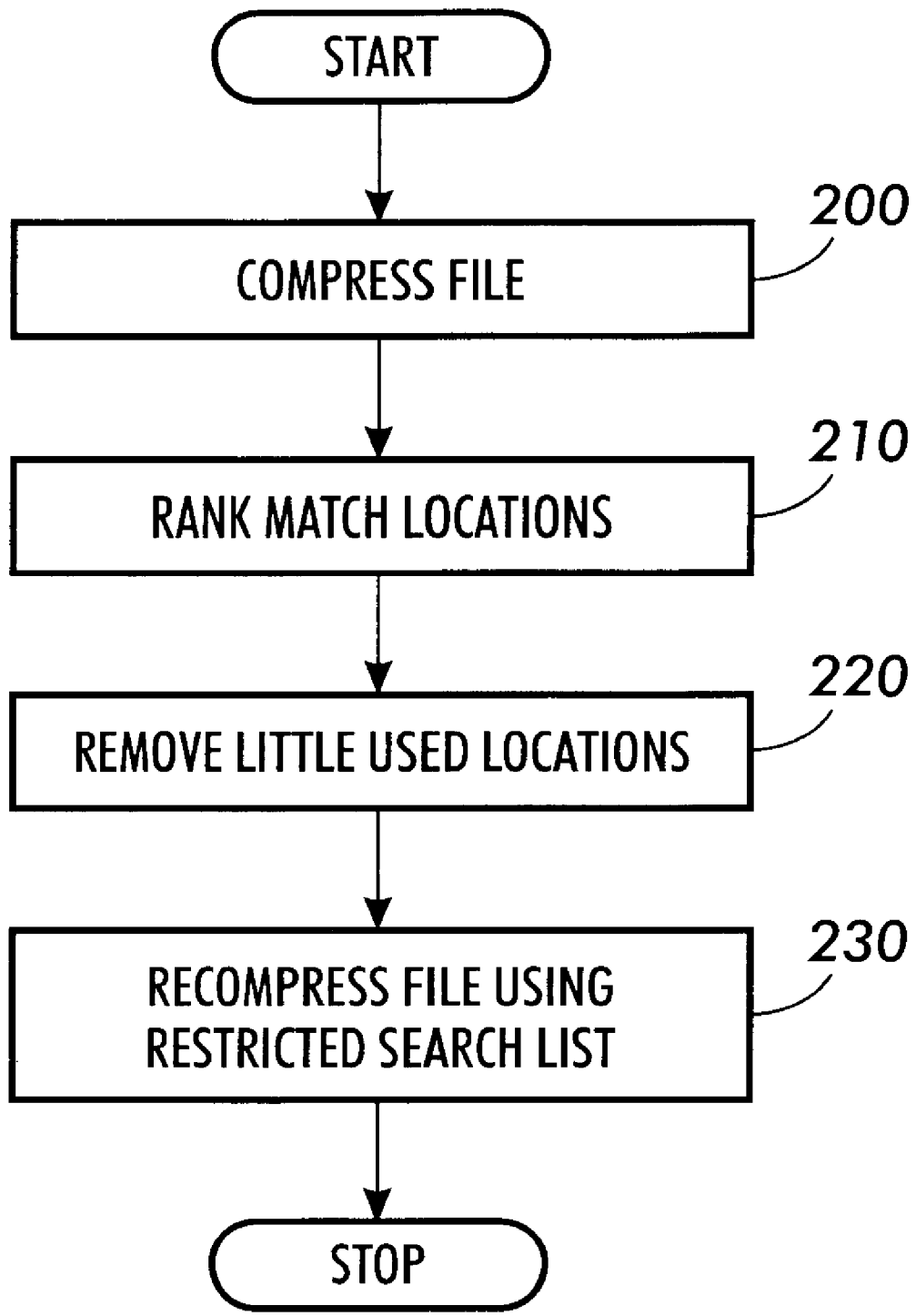
FIG. 5 is a flowchart illustrating an embodiment of a method for identifying possible match locations.

Another source of hotspots can be obtained from analysis of the compressed file. FIG. 5 illustrates one method of identifying hotspots by analysis of the compressed file. More specifically, there is shown one iteration in the method for identifying hotspots by analysis of the compressed file. The process starts with a standard compression of the file at step 200. Next, the result of the compression is analyzed to identify the number of times each location was identified as a match and the average length of the match at that location (step 210). The locations are then ranked either by one or more of number of times identified, average length or total length (average length multiplied by times identified). Those locations which account for a small portion of the compression matches (either by number of matches or the average or total length of pattern matches) are removed consideration as possible locations to match to thereby generate a restricted search list (step 220).

For example, an analysis of a typical GZIP compressed stream of block ordered pixel data shows that there are certain relative pixel locations that are significantly more likely to contain a matching pattern than the average pixel location. In the case of 8×8 blocks (a useful size, since JPEG uses the same size blocks), the most likely relative locations where a match can be found, in order of descending probability, are at a distance of 8, 1, and 64 pixels. This is not surprising: the distance 8 hotspot represents the previous scanline of data; the distance 1 hotspot represents the previous pixel; and the distance 64 hotspot represents the previous 8×8 block. In comparison to the fraction of pattern matches that occurred at these hotspots, the other distances occur very infrequently. This suggests that the pattern matches found at other distances might be discarded.

The file is then recompressed using the restricted search list at step 230. The steps of ranking matches, removing/ restricting search locations and recompressing the restrict search list can be repeated until the recompression does not show a significant improvement. If the result of a recompression does not show significant improvement, the process can end with the restricted search list identifying the compression hot spots. If the compression ratio is worse, the most recently removed locations may be returned to the search list. If the resulting list of hotspot compression locations is too large, the process may be rerun selecting different locations to remove.

The match locations and match lengths are often encoded via an entropy coding scheme such as Huffman coding. Further improvements in performance can be obtained by using the prior knowledge of "hotspots" probabilities to pre-generate Huffman tables that are nearly as efficient as dynamically generating the tables. Dynamically generated Huffman tables require the generation of frequency distributions and then generation of optimal Huffman coding trees from these distributions lowering performance or requiring additional hardware.

What has been described is an improved sliding window compression process limits the data within the sliding window searched to data strings occurring at a plurality of predefined match locations. While many of the specific examples discussed above used pixel data, it will be appreciated that the teachings of the present invention can also be used for other data sets where a likelihood of finding a good string match can be pre-determined and results in a small number of consistent locations that need to be searched.

The improved method can be used to take advantage of the capabilities of processors with a high degree of parallelism to reduce compression time. The improved method also improves performance on serial processors for appropriate data sets. Furthermore, the method of the present invention can significantly reduces the cost of a hardware ASIC implementation by providing an alternative to the prohibitively large 32 k of very specialized "memory" required to implement a conventional the sliding pattern match window.

The disclosed method may be readily implemented in software using object oriented software development environments that provide portable source code that can be used on a variety of computer or workstation hardware platforms. Alternatively, the disclosed image processing system may be implemented partially or fully in hardware using standard logic circuits or specifically on a single chip using VLSI design. Whether software or hardware, or combinations there of, is used to implement the system varies depending on the speed and efficiency requirements of the system and also the particular function and the particular software or hardware systems and the particular microprocessor or microcomputer systems being utilized. The image processing system, however, can be readily developed by those skilled in the applicable arts without undue experimentation from the functional description provided herein together with a general knowledge of the computer arts.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. A method of compressing data, comprising:

receiving an input stream of data, the input stream including a sequence of data elements to be compressed;

identifying a coding position;

identifying a compress string within the input stream, the compress string including a set of data elements occurring at the coding position;

comparing the compress string with a string of data elements at each match location within a plurality of predefined match locations to determine if a match exists at the respective match location, the plurality of predefined match locations defining a set of discrete, non-continuous data elements form the input stream;

identifying a best match location, the best match location having the longest string of continuous data elements matching a compress string comprising a corresponding number data elements; and providing a pointer, the pointer identifying the best match location and the length of the compress string.

2. The method of compressing data according to claim 1, further comprising using a predefined table based for entropy coding of the match locations.

3. The method of compressing data according to claim 1, wherein the predefined match locations are identified as an offset from the coding position.

4. The method of compressing data according to claim 1, wherein each match location within the plurality of predefined match locations is defined as an absolute position within the input stream.

5. The method of compressing data according to claim 1, wherein the step of receiving an input stream of data includes:

receiving raster ordered image data, the raster ordered image data comprising a plurality of scan lines with each scan line having a plurality of pixels; and converting the raster ordered image data into block ordered data.

6. A method of compressing data, comprising:

receiving an input stream of data, the input stream including a sequence of data elements to be compressed;

selecting a compress string within the input stream, the compress string including at least one data element occurring at a coding position;

identifying a plurality of match locations associated with the coding position;

setting a status for each match location with the plurality of match locations, the status identifying whether the corresponding match location is active or inactive;

simultaneously comparing the compress string with data elements match locations having an active status to determine if a match exists at the respective match location, and updating the status of the match location based on the comparison;

increasing the length of the compress string by adding at least one data element to the compress string;

repeating the steps of simultaneously comparing and increasing the length of the compress string until all match locations within the plurality of match locations have an inactive status;

providing a pointer, the pointer identifying a match location which matches the compress string and the length of the compress string.

7. The method according to claim 6, further comprising using a predefined table based for entropy coding of the match locations.

8. The method according to claim 6, further comprising:

updating a match length indicator for at least one match location based on a result of the step of simultaneously comparing.

9. The method according to claim 8, wherein the step of providing a pointer, includes identifying a match location having a match length indicator greater than a minimum match length.

10. The method according to claim 8, wherein the step of providing a pointer, includes identifying a match location having the longest match length indicator.

11. The method of compressing data according to claim 6, wherein the step of receiving an input stream of data includes:

receiving raster ordered image data, the raster ordered image data comprising a plurality of scan lines with each scan line having a plurality of pixels; and converting the raster ordered image data into block ordered data.

12. The method according to claim 6, wherein the plurality of match locations define a set of discrete, non-continuous data elements from the input stream.

13. A method of compressing data, comprising:

receiving an input stream of data, the input stream including a sequence of data elements to be compressed, wherein the input stream of data includes raster ordered image data comprising a plurality of scan lines with each scan line having a plurality of pixels;

converting the raster ordered image data into block ordered data;

identifying a coding position;

identifying a compress string within the block ordered data, the compress string including a set of data elements occurring at the coding position;

comparing the compress string with a string of data elements at each match location within a plurality of predefined match locations to determine if a match exists at the respective match location, the plurality of predefined match locations defining a set of discrete, non-continuous data elements from the input stream; and providing a pointer, the pointer identifying a match location which matches the compress string and the length of the compress string.

14. The method of compressing data according to claim 13, further comprising using a predefined table based for entropy coding of the match locations.

15. The method of compressing data according to claim 13, wherein the predefined match locations are identified as an offset from the coding position.

16. The method of compressing data according to claim 13, wherein each match location within the plurality of predefined match locations is defined as an absolute position within the input stream.

* * * * *